(12) United States Patent
Gether

(10) Patent No.: US 10,304,438 B2
(45) Date of Patent: May 28, 2019

(54) NOISE-CANCELLATION SYSTEM AND METHOD FOR NOISE CANCELLATION

(71) Applicant: ams AG, Unterpremstätten (AT)

(72) Inventor: Horst Gether, Straden (AT)

(73) Assignee: ams AG, Unterpremstaetten (AT)

( * ) Notice: Subject to any disclaimer, the term of this patent is extended or adjusted under 35 U.S.C. 154(b) by 348 days.

(21) Appl. No.: 14/354,488

(22) PCT Filed: Oct. 10, 2012

(86) PCT No.: PCT/EP2012/070072
§ 371 (c)(1),
(2) Date: Apr. 25, 2014

(87) PCT Pub. No.: WO2013/060574
PCT Pub. Date: May 2, 2013

(65) Prior Publication Data
US 2014/0270225 A1    Sep. 18, 2014

(30) Foreign Application Priority Data
Oct. 26, 2011    (DE) .................... 10 2011 116 991

(51) Int. Cl.
*G10K 11/178* (2006.01)
*H03K 17/955* (2006.01)
(Continued)

(52) U.S. Cl.
CPC ...... *G10K 11/178* (2013.01); *G10K 11/17833* (2018.01); *G10K 11/17854* (2018.01);
(Continued)

(58) Field of Classification Search
USPC .......... 381/71.7, 83, 73.1, 93, 71.6; 704/233
See application file for complete search history.

(56) References Cited

U.S. PATENT DOCUMENTS 8,085,944 B2 * 12/2011 Kassner .................. F01N 1/065
                                                    181/206
8,452,020 B2 *  5/2013 Gregg .................... H04R 3/12
                                                    381/109

(Continued)

OTHER PUBLICATIONS

Intersil, Proximity sensors, Mar. 2009.*
"Smart noise cancellation", Mason Publications, Bd. 553, No. 12, May 1, 2010, p. 473, XP007139777; ISSN: 0374-4353.

*Primary Examiner* — Davetta W Goins
*Assistant Examiner* — Kuassi Ganmavo
(74) *Attorney, Agent, or Firm* — Fish & Richardson P.C.

(57) ABSTRACT

A noise-cancellation system for a headphone (HP) that comprises a speaker (200, 210) for emitting a speaker signal, a microphone (300, 310, 320, 330) for receiving a microphone signal and a proximity sensor (400, 410) for a receiving a proximity signal comprising quantitative information on the distance of the an object (OBJ) from the proximity sensor (400, 410) has a signal processing device (100). The signal processing device (100) is designed to generate a compensation signal based on the microphone signal, wherein the generation of the compensation signal comprises filtering with an adjustable filter characteristic. The compensation signal is combined with an audio signal in order to generate the speaker signal. The filter characteristic is adapted based on the distance.

25 Claims, 6 Drawing Sheets

Figure 1:
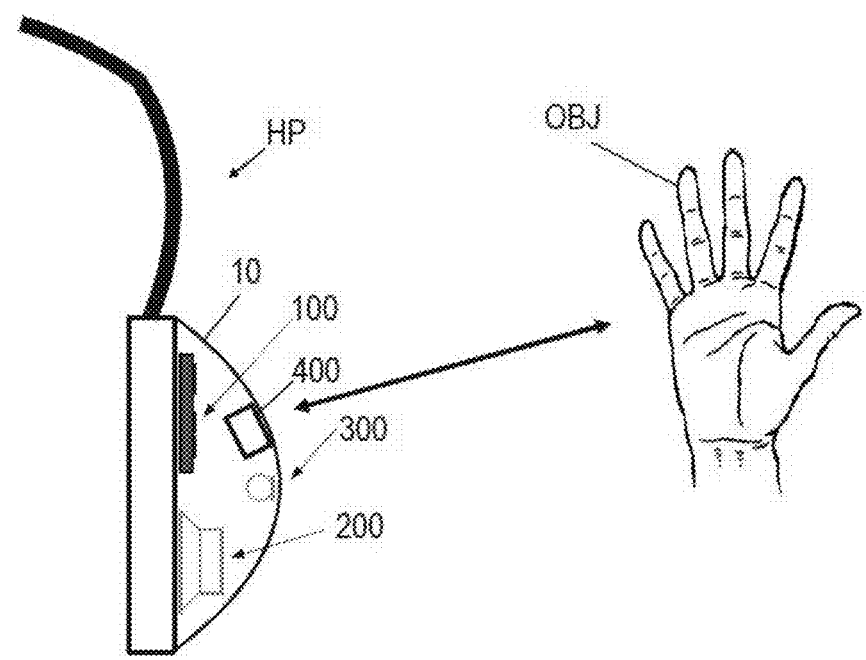

(51) Int. Cl.
*G01V 3/08* (2006.01)
*G01B 7/00* (2006.01)
*G01B 7/14* (2006.01)

(52) U.S. Cl.
CPC ........ *G10K 11/17873* (2018.01); *G01B 7/003* (2013.01); *G01B 7/14* (2013.01); *G01V 3/088* (2013.01); *G10K 2210/1081* (2013.01); *G10K 2210/3016* (2013.01); *G10K 2210/3027* (2013.01); *G10K 2210/3028* (2013.01); *G10K 2210/3226* (2013.01); *H03K 17/955* (2013.01); *H03K 2217/960705* (2013.01)

(56) References Cited

U.S. PATENT DOCUMENTS

| | | | | |
|---|---|---|---|---|
| 8,494,507 | B1* | 7/2013 | Tedesco | A61F 4/00 434/112 |
| 8,526,627 | B2* | 9/2013 | Asao | G10K 11/1784 381/71.1 |
| 2002/0028699 | A1* | 3/2002 | Moquin | H04M 1/60 455/569.1 |
| 2002/0161577 | A1* | 10/2002 | Smith | G10L 21/0272 704/233 |
| 2004/0253994 | A1* | 12/2004 | Lampl | H04M 1/605 455/569.1 |
| 2005/0238190 | A1* | 10/2005 | Rohrlein | H03G 3/04 381/312 |
| 2006/0069556 | A1* | 3/2006 | Nadjar | G10K 11/178 704/229 |
| 2008/0112570 | A1* | 5/2008 | Asada | G10K 11/1782 381/71.6 |
| 2008/0157991 | A1* | 7/2008 | Raghunath | G11B 31/02 340/686.1 |
| 2008/0167834 | A1* | 7/2008 | Herz | G06F 1/3203 702/150 |
| 2008/0225005 | A1* | 9/2008 | Carroll | G06F 1/1626 345/169 |
| 2009/0287327 | A1 | 11/2009 | Hsu et al. | |
| 2010/0296668 | A1* | 11/2010 | Lee | G10K 11/1784 381/94.7 |
| 2010/0322433 | A1* | 12/2010 | Hsieh | G10K 11/1786 381/71.8 |
| 2011/0084709 | A1* | 4/2011 | Asjes | H03K 17/955 324/658 |
| 2011/0206214 | A1* | 8/2011 | Christoph | G10K 11/1784 381/71.6 |
| 2012/0035883 | A1* | 2/2012 | Teissier | G01V 3/088 702/150 |

* cited by examiner

NOISE-CANCELLATION SYSTEM AND METHOD FOR NOISE CANCELLATION

The invention relates to a noise-cancellation system for a headphone and to a method for noise cancellation for a headphone.

In some conventional headphones, active noise cancellation is performed in order to shield the headphone user from interfering outside noises. To this end, a signal containing the interference noises to be suppressed as a noise signal is typically recorded with a microphone provided for that purpose. After appropriate processing, this signal is superimposed in inverted form on an audio signal so that the recorded and processed interference signal and the actual interference signal appearing in the vicinity of the headphone at least partially cancel out one another.

A number of approaches to this are known. For example, the microphone may be positioned on the exterior of the headphone, so that only sounds outside the headphone are picked up and are available for noise cancellation. Such a system is also referred to as a forward system or a feedforward system. It is also possible to position a microphone in the interior of the headphone housing, so that some components of the speaker signal and ambient noise are picked up by the microphone. With appropriate processing, a superimposition signal is again formed, which cancels out the interfering ambient noise.

The microphone signals may be processed, for example, by bringing the microphone signal to a defined level and subjecting it to filtering. The selection of the level and a filter function depend here in particular on the special design of the headphone and the positioning of the microphone.

If the transmission characteristics of the headphone speaker or the microphone are changed due to outside influences such as pressure on the headphone, for example, the parameters for processing the microphone signal are usually no longer optimally adapted to the changed circumstances. For example, there may be feedback of the superimposed compensation signal from the speaker to the microphone, which leads to oscillations in the noise-cancellation system. Therefore the effectiveness of the noise-cancellation system is impaired.

One object to be achieved is to specify an improved concept for a noise-cancellation system in a headphone that enables sufficient performance even with modified operating parameters.

This object is achieved with the subject matter of the independent claims. Refinements and configurations are the subject matter of the dependent claims.

For the present purpose, a proximity sensor that outputs a proximity signal is provided for a conventional headphone with a noise-cancellation system, for example. The proximity signal contains information as to whether an object is in the vicinity of the headphone and in particular how far away this object is from the headphone, for example. A filter characteristic with which a microphone signal of the existing noise cancellation microphone is processed can be adjusted based on this proximity signal. Thus a respective favorable filter characteristic can be set that is adapted to the environmental conditions and transmission properties of the headphone. Consequently, the capability of the noise cancellation can be increased in comparison to a conventional headphone with noise cancellation. Oscillations and thus a severe impairment of the noise cancellation under unfavorable transmission conditions of the headphone can also be prevented.

One embodiment specifies a noise-cancellation system for a headphone in which the headphone comprises a speaker for emitting a speaker signal, a microphone for receiving a microphone signal and a proximity sensor for receiving a proximity signal that comprises quantitative information on a distance of an object from the proximity sensor. The noise-cancellation system has a signal processing device that is designed to generate a compensation signal based on the microphone signal, wherein the generation of the compensation signal comprises filtering with an adjustable filter characteristic. The signal processing device is additionally designed to combine the compensation signal with an audio signal in order to generate the speaker signal. The signal processing device is also designed to adapt the filter characteristic based on the proximity signal, particularly the distance.

The headphone may be a mono headphone, for example, in which the microphone is mounted on or in a housing for the speaker of the headphone. In addition, the proximity sensor is mounted on the headphone in such a manner that an approach of an object that can change the transmission characteristics of the headphone can be detected. The signal processing device, which is integrated in the headphone for example, evaluates the proximity signal and, based on the proximity or distance of an object, varies the filter characteristic, for example, in a manner such that the filter characteristic is adapted to the respective momentary transmission characteristics of the headphone. Thus a compensation signal can be generated that is adapted in each case to the environmental conditions of the headphone.

In different implementations, the noise-cancellation system or the signal processing device can also be designed for a stereo headphone with at least two speakers, so that a separate microphone signal is received with a separate microphone for each audio channel in order to generate corresponding compensation signals. Accordingly, a separate proximity sensor that detects an approach of an object in the area of the associated speaker or microphone can also be provided for both sides or both channels of the headphone. The respective filter characteristic for each of the two stereo channels can be adapted independently of the other. For the sake of a simpler presentation, the description will be continued for a headphone with only one audio channel. Corresponding implementations for a stereo headphone follow in a corresponding manner.

The filter characteristic is adapted, for example, in that the signal processing device adjusts a gain factor of the filter characteristic. In case of a larger distance of an object or in case there is no object in the vicinity of the headphone, for example, a high gain factor is selected for the filter characteristic, so that the resulting compensation signal includes comparatively large portions of an interference signal contained in the microphone signal. Thereby the user receives the impression of a good cancellation of the acoustic interference signal, so that the efficiency of the noise-cancellation system is increased.

If it is detected via the proximity signal from the signal processing device that an object is in the vicinity of the headphone, so that there are feedbacks of the speaker signal to the microphone signal, the gain factor of the filter characteristic can be lowered sufficiently that oscillations are prevented by incorporating the compensation signal into the microphone signal. Consequently, an overcompensation of an interfering acoustic signal is prevented and thereby a high efficiency of the noise-cancellation system is again achieved.

The gain factor is adapted, for example, by adjusting the gain of a microphone amplifier that amplifies the received microphone signal and preferably supplies it to the filtering process. In other words, the filter characteristic in this implementation comprises, among other things, the gain of a microphone amplifier and a transfer function of a filter.

The gain factor can be adapted in different implementations in only two stages, for example by changing over between a high and a low gain if an evaluation of the proximity signal only shows whether there is an object present, for example.

In various implementations, however, the proximity signal also comprises information regarding a distance of an object from the proximity sensor. The signal processing device in this case is designed to adapt the gain factor incrementally or continuously based on the distance. For example, the proximity signal may be evaluated in such a manner that the distance is detected and the gain factor to be adjusted is determined based on the detected distance, perhaps by means of a calculation based on a predefined function. It is also possible, however, for corresponding gain factors for various predetermined distances or distance ranges to be stored in a table or the like, so that a defined gain factor is associated with each distance.

In various additional implementations, the signal processing device is designed to adapt a transfer function of the filter characteristic. In particular, a filter function of a filter is adapted in this case. Due to the approach of an object to the headphone or the proximity sensor, certain frequencies in the transmission behavior of the filter, particularly threshold frequencies or cutoff frequencies, can change. These changes can firstly be characterized by a frequency shift and secondly can result in a change of an amplitude in the transfer function at a defined frequency. In order to take these changes in the compensation of the interference noise into account, it is advantageous to correspondingly adapt the transfer function of the filter with which the microphone signal is filtered to the changed conditions. Consequently, the efficiency of the noise-cancellation system is again increased.

The transfer function can be adapted based on various stored and previously determined transfer functions. For example, the signal processing device may be designed to select a transfer function from a group of at least two stored transfer functions based on the distance.

In various implementations, the proximity sensor comprises at least one of the following: a capacitive proximity sensor, a proximity sensor based on infrared radiation, a brightness sensor or a pressure sensor.

In a capacitive proximity sensor, the change of the capacitive properties at an electrode or between two electrodes, caused by the proximity of an object such as a human hand for example, is detected.

In a proximity sensor based on infrared radiation, a source signal is transmitted with an infrared source such as a light emitting diode irradiating light in the infrared range, for example, and is reflected from an object in the vicinity and finally received by a sensor such as a phototransistor or a photodiode that is sensitive to infrared radiation. Measurement of the reflected infrared radiation or the received infrared radiation allows an inference of the proximity of an object to the proximity sensor.

In a brightness sensor, the proximity of an object can be detected based on a varying brightness. In a pressure sensor, a pressure on the sensor or the headphone on which the pressure sensor is arranged can be determined, wherein the presence of a defined pressure allows an inference of the proximity of an object to the proximity sensor.

The various described proximity sensors can also be combined in order to obtain more precise information about the proximity of an object, for example. Other sensors that allow detection of an object that is approaching or that is in the vicinity can also be used.

In various implementations, the signal processing device is formed as an integrated circuit on a semiconductor body. Such an integrated signal processing device can be arranged, for example, in the headphone and/or in a supply line for the headphone. For this purpose, the noise-cancellation system comprises the headphone itself, for example. In other configurations, the noise-cancellation system is integrated in an audio device, particularly a mobile audio device, wherein corresponding lines for the speaker signal, the microphone signal and the proximity signal are run from the headphone to the audio device for each audio channel, or corresponding connections for such lines are provided, for example.

The proximity sensor may be provided on the housing of the headphone, particularly on an exterior side of the housing. The housing comprises, for example, the loudspeaker and the microphone.

The various implementations of the noise-cancellation system can be implemented in a method for noise cancellation for a headphone that comprises a speaker for emitting a speaker signal and a microphone for receiving a microphone signal, with a proximity sensor for receiving a proximity signal that comprises quantitative information on a distance of an object from the proximity sensor. In the method, a compensation signal is generated based on the microphone signal, wherein the generation of the compensation signal comprises filtering with an adjustable filter characteristic. The compensation signal is combined with an audio signal in order to generate the speaker signal. The filter characteristic is adapted based on the proximity signal, more particularly the distance. By adapting the filter characteristics based on the proximity signal, a suitable filter characteristic for a noise cancellation can be selected based on the proximity of an object to the headphone or the proximity sensor in order to achieve a high efficiency in the noise cancellation.

For example, the adaptation of the filter characteristic may comprise an incremental or continuous adaptation of a gain factor of the filter characteristic based on the distance. Alternatively or additionally, it is possible for the adaptation of the filter characteristic to comprise a selection of a transfer function for the filter characteristic from a group of at least two stored transfer functions based on the distance.

Various additional configurations of the described method follow directly from the previously described implementations of the noise-cancellation system.

The invention will be described in detail below for several embodiment examples with reference to figures. Identical reference numbers designate elements or components with identical functions. Insofar as circuit parts or components correspond to one another in function, their descriptions will not be repeated in each of the following figures.

Figure 3A:
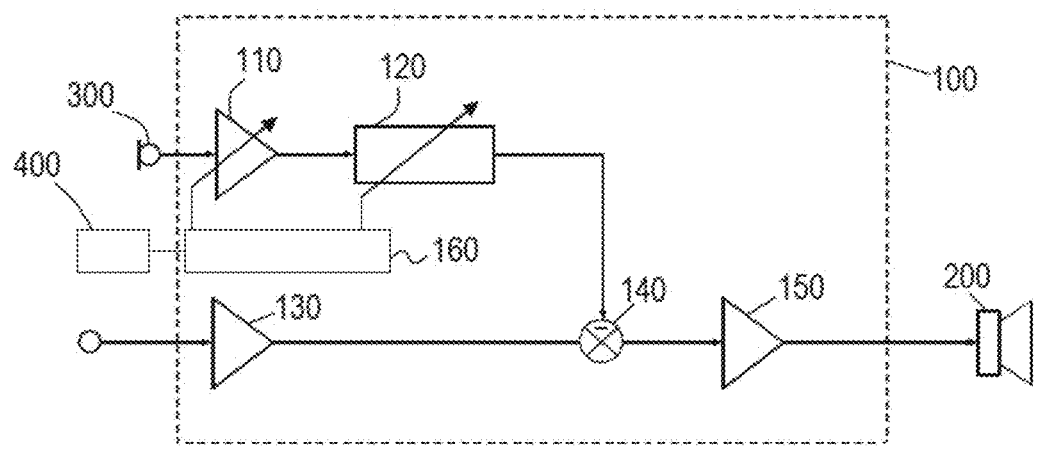
Figure 3B:
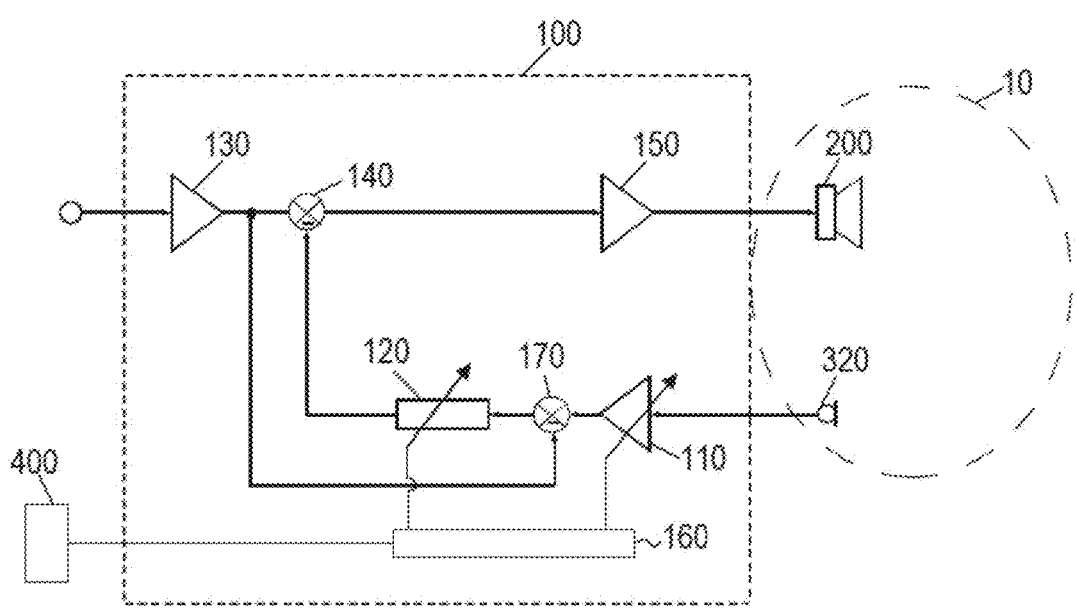
Figure 4:
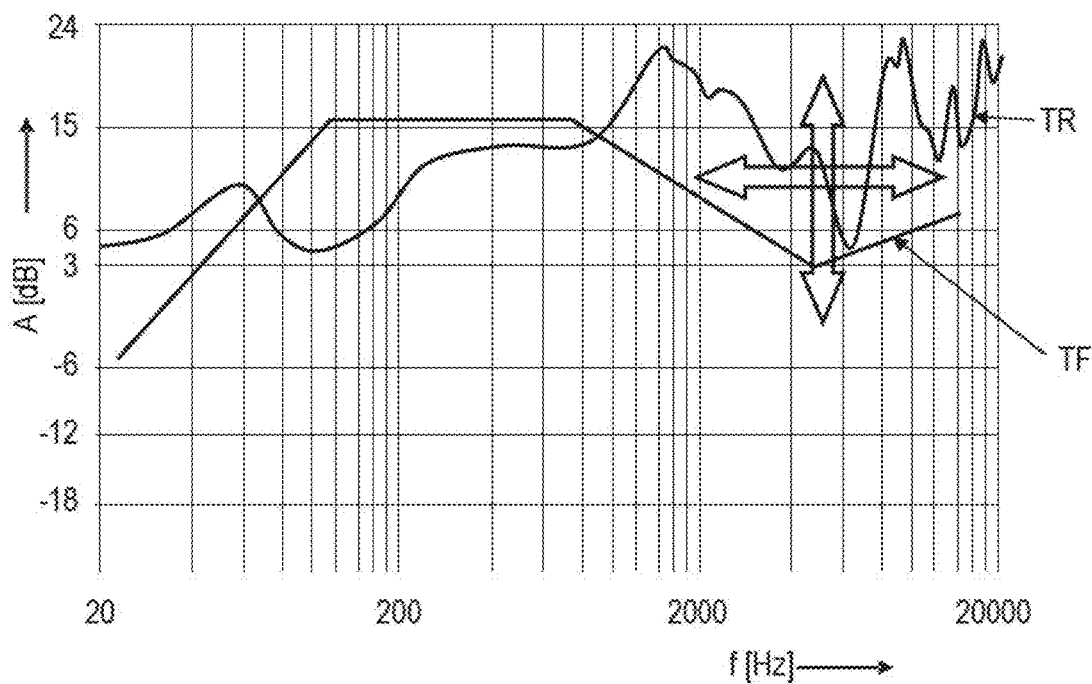
Figure 5:
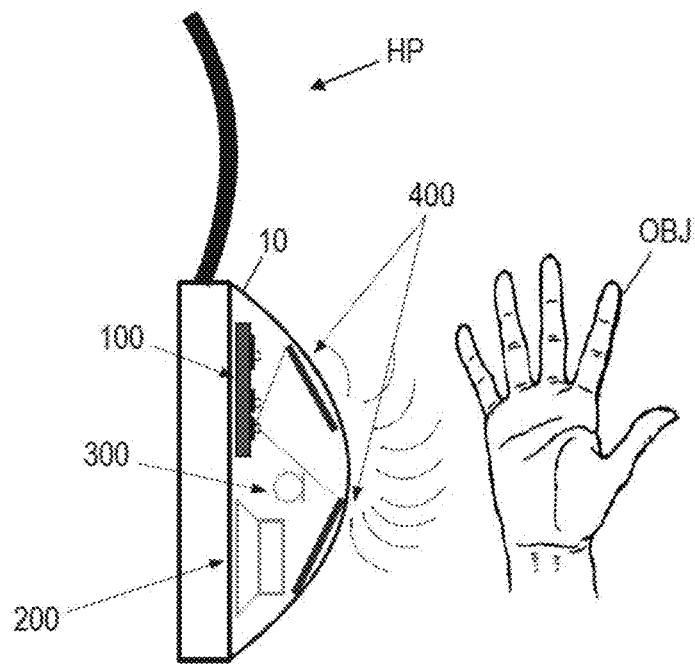
Figure 6:
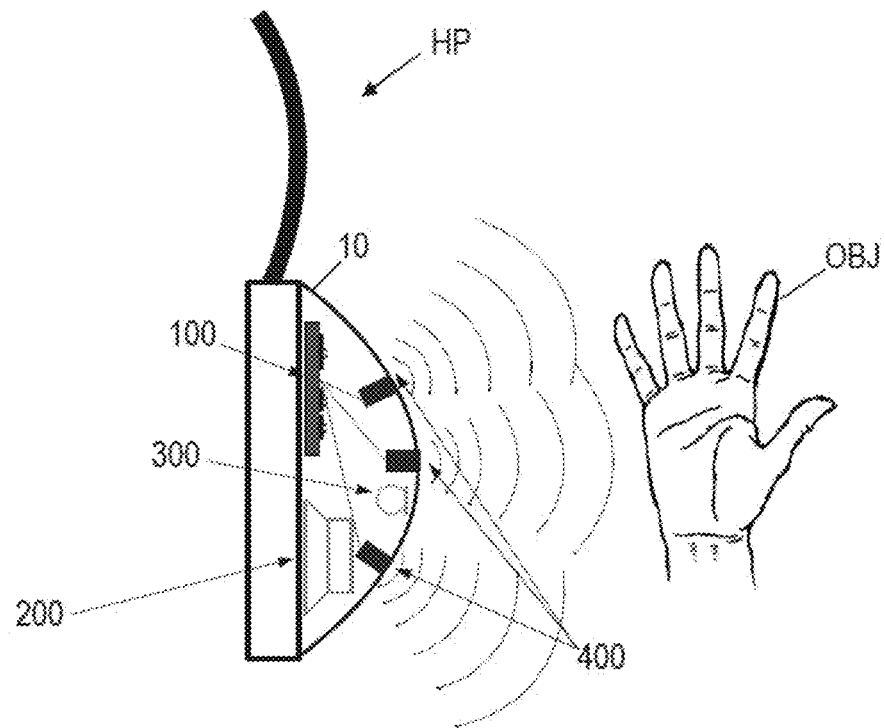
Figure 7:
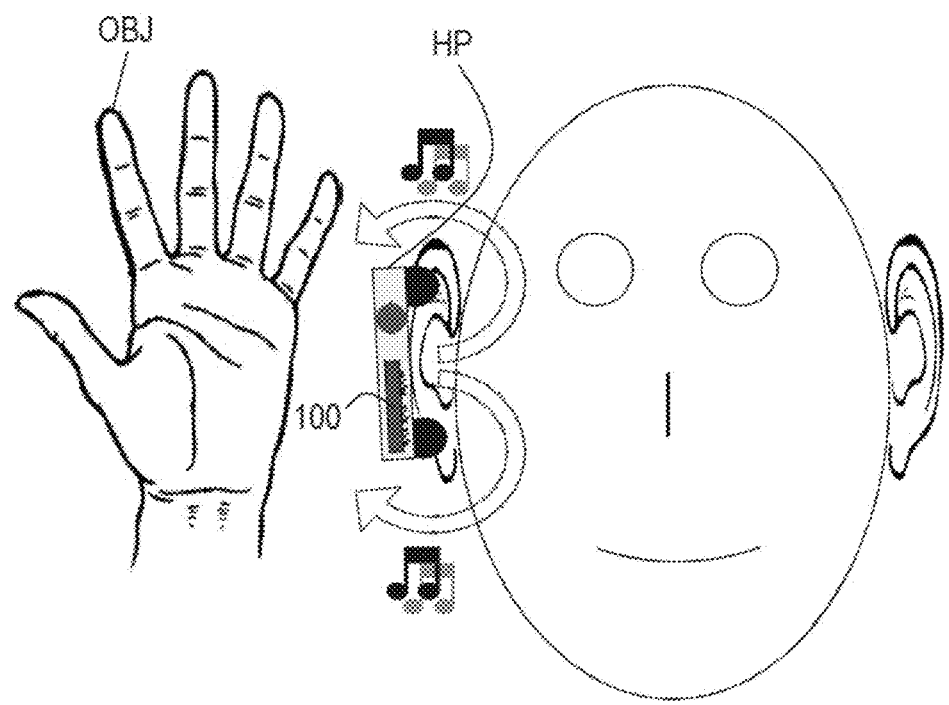
Figure 8:
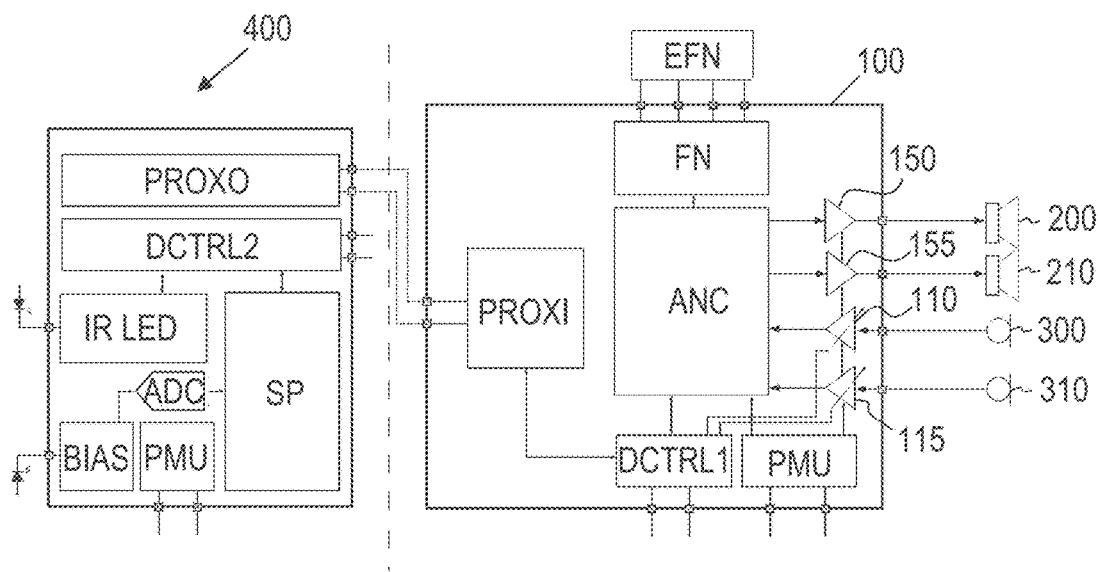
Figure 9:
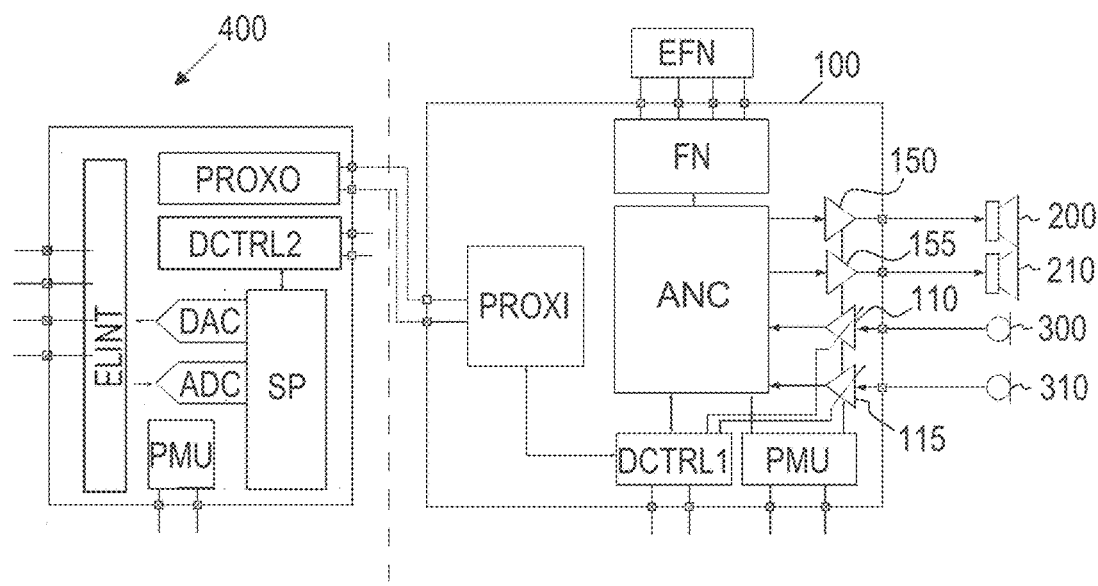

In the drawings:

FIG. 1 shows a schematic representation of one embodiment of a noise-cancellation system for a headphone, FIG. 2 shows various embodiments of a noise-cancellation system for a headphone, FIG. 3 shows block schematic diagrams of different embodiments of the noise-cancellation system, FIG. 4 shows a frequency diagram with transfer function examples, FIG. 5 shows a schematic representation of an additional embodiment of a noise-cancellation system for a headphone, FIG. 6 shows a schematic representation of an additional embodiment of a noise-cancellation system for a headphone, FIG. 7 shows a schematic representation of an additional embodiment of a noise-cancellation system for a headphone, FIG. 8 shows a block schematic diagram of an additional embodiment of a noise-cancellation system, and FIG. 9 shows a block schematic diagram of an additional embodiment of a noise-cancellation system.

FIG. 1 shows a schematic representation of a headphone HP with a noise-cancellation system. The headphone HP comprises a housing 10, in which a signal processing device 100, a speaker 200, a microphone 300 and a proximity sensor 400 are arranged. The microphone 300 is directed outward with respect to its reception direction in order to preferentially receive sounds outside the housing 10 and to generate a corresponding microphone signal. The speaker 200 is used for outputting a speaker signal, which is generated in particular by the signal processing device 100 based on an externally supplied audio signal and the microphone signal. A proximity signal that comprises a distance of an object OBJ from the headphone HP or the housing 10 can be recorded via the proximity sensor 400. The object OBJ is shown here as a human hand for the sake of example. Information in the proximity signal regarding the distance of the object OBJ can comprise quantitative information on the distance. It is also possible, however, for this information to contain only qualitative information regarding the distance of the object OBJ, for example, whether or not the object OBJ is present in the vicinity.

In the embodiment shown in FIG. 1, the noise-cancellation system is a forward-coupling system or feed-forward system, in which the microphone signal comprises in particular an interference noise outside the headphone HP or the housing 10, which is filtered by the noise-cancellation system with an adjustable filter characteristic in order to generate a compensation signal. In the signal processing device 100, this compensation signal is superimposed on the externally supplied audio signal in order to generate the speaker signal, which is output via the speaker 200. The component of the compensation signal in the speaker signal is superimposed for the user of the headphone with the external interference noise in such a manner that the respective acoustic waves at least partially cancel one another.

The externally supplied audio signal comes, for example, from an audio device, particularly a mobile audio device such as an MP3 player, a mobile telephone or the like. The filter characteristic with which the microphone signal is processed depends on the conditions of the headphone HP, particularly the transfer properties between the speaker 200 and the microphone 300, the design of the housing 10, etc. These conditions can change during operation of the headphone HP, however. Therefore, a filter characteristic that is suitable for a variety of different conditions is chosen for conventional noise-cancellation systems. The filter characteristic in such conventional noise-cancellation systems is not optimally adapted to existing conditions in every case, however, due to its universal applicability.

In the illustrated embodiment, the proximity signal recorded by the proximity sensor 400 is therefore evaluated by the signal processing device 100 in order to detect a change in the conditions at the headphone HP or the housing 10. The filter characteristic is adapted according to the detected condition. The filter characteristic is accordingly adapted based on the proximity signal. This has the effect that a filter characteristic adapted to the respective existing condition is used for processing the microphone signal. Thereby the performance of the noise-cancellation system is increased. The filter characteristic can be adapted, for example, by changing a gain factor with which the microphone signal is processed. It is also possible for a filter transfer function of the filter characteristic to be varied.

During operation of the noise-cancellation system or the headphone HP, there is generally no coupling between the speaker 200 and the microphone 300 in the embodiment shown in FIG. 1, so that the microphone signal contains no or only negligibly small components of the speaker signal. Under changing conditions such as the proximity of an object, such a coupling can arise so that parts of the speaker signal, which in turn contain the compensation signal, are received via the microphone signal. This can lead to oscillations in the speaker signal that reduce the performance of the noise-cancellation system and deteriorate the acoustic impression of the person using the headphone HP. If the noise-cancellation system or the signal processing device 100 recognizes, based on the proximity signal, such a proximity of the object OBJ and thus a change in the conditions, the gain factor of the microphone signal can be reduced so that the oscillation effect is prevented or eliminated. However, if no object is in the vicinity of the headphone 10 and therefore there is no coupling or only a negligible coupling between the speaker 200 and the microphone 300, the gain factor for the microphone signal can be increased in order thereby to achieve a higher degree of compensation of the control signal. The efficiency of the noise-cancellation system can thus be improved, particularly in comparison to a conventional noise-cancellation system with a permanently set gain factor.

In a similar manner, frequency-dependent transmission properties of the headphone can also be changed by the proximity of an object, which makes a variation of the filter transfer function for filtering the microphone signal advantageous. Accordingly, it is possible to select or adjust a respective filter function adapted to the existing conditions, with which optimal processing of the microphone signal becomes possible.

Figure 2A:
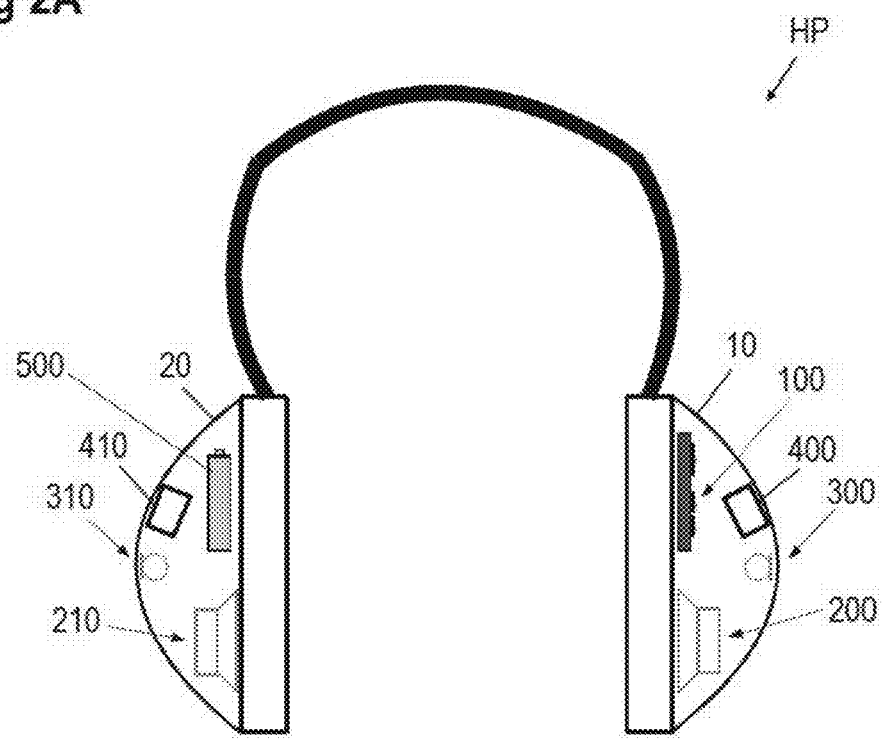
Figure 2B:
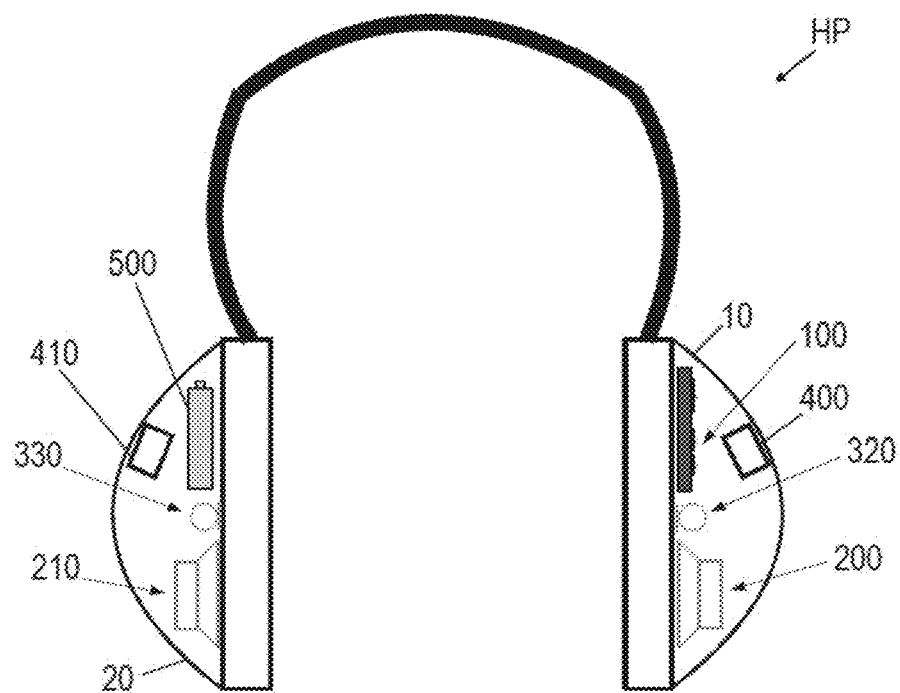
Figure 2C:
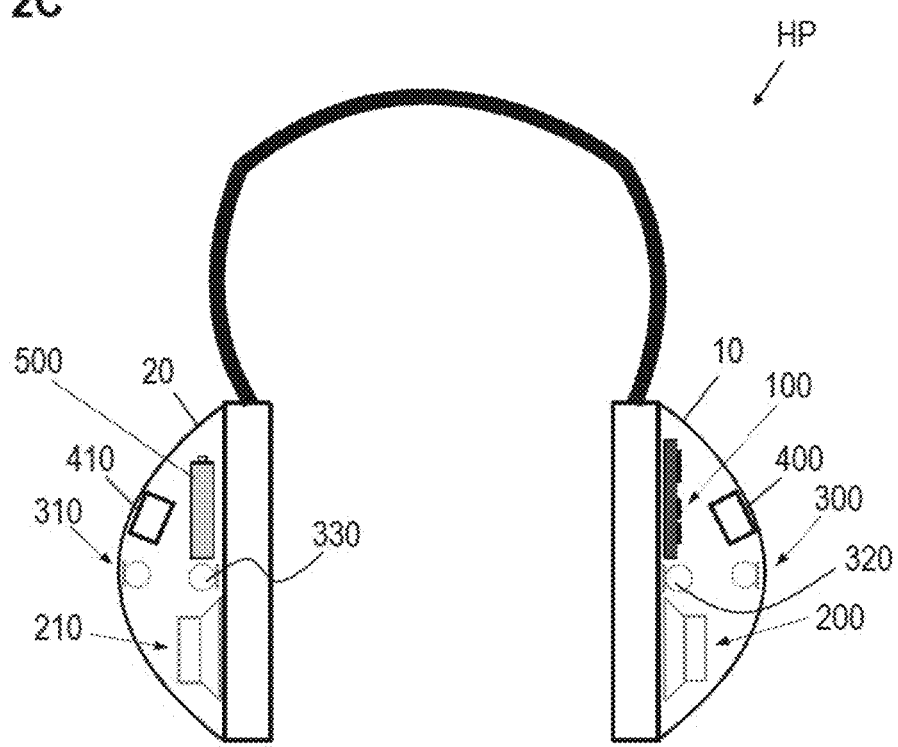

Whereas only a noise-cancellation system for a single audio channel is shown in FIG. 1, FIG. 2 shows various embodiments of a headphone HP implementing a stereo system with two audio channels with a noise-cancellation system. FIG. 2A represents an embodiment of a noise-cancellation system with feed-forward, FIG. 2B represents an embodiment of a noise-cancellation system with feedback, and FIG. 2C represents a noise-cancellation system with a combination of feed-forward and feedback.

In addition to the elements already described for FIG. 1, the embodiment in FIG. 2A comprises a second speaker 210 for the second audio channel, a second outward-directed microphone 310 and a second outward-directed proximity sensor 410, which are arranged in or on a housing 20. A battery 500, which is used for supplying power to the noise-cancellation system for example, is also provided in the housing 20.

The two audio channels are processed independently of one another. In particular, the filter characteristic of each channel is adapted based on the respective proximity signal that is received by the proximity sensors 400, 410. The type of adaptation for the second audio channel corresponds to that which was described for FIG. 1, however.

Differing from the previously illustrated embodiments, the noise-cancellation system shown in FIG. 2B with a feedback of the microphone signal comprises inward-directed microphones 320, 330, which receive a noise in the interior of the housing 10, 20. The respective microphone signal accordingly comprises both components of external interference noises and the speaker signal. The components of the speaker signal, however, are eliminated in the processing of the microphone signal, for example by calculating them out or by circuitry-related processing. There is again a filtering of the microphone signal in order to obtain a compensation signal that is superimposed on the external audio signal.

The filter characteristic is adapted as in the previously described embodiments.

FIG. 2C illustrates a noise-cancellation system in which feed-forward and feedback are combined. For this purpose, both outward-directed microphones 300, 310 and inward-directed microphones 320, 330 are provided. The respective microphone signals are processed according to the previous description and combined with one another in order to generate the respective compensation signal by appropriate processing. In this embodiment as well, the respective filter characteristic is adapted based on of the respectively associated proximity signals, corresponding to the previously described embodiments.

FIG. 3 shows block schematic diagrams of various implementations of a signal processing device 100 with connected speaker 200, microphone 300 and proximity sensor 400. FIG. 3A shows an implementation with feed-forward, while FIG. 3B shows an implementation with feedback.

The signal processing device 100 comprises a microphone amplifier 110, which is connected on the input side to the microphone 300 for supplying the microphone signal. An output of the microphone amplifier 110 is connected to a filter unit 120. The signal processing unit 100 further comprises a signal amplifier 130 to which an audio signal, more particularly a useful signal, is supplied on the input side. An output of the signal amplifier 130 is connected to a summing member 140, the second input of which is fed an output signal of the filter unit 120 in negative form. An output of the summing member 140 is coupled via an output amplifier 150 coupled to the speaker 200. The signal processing device 100 further comprises an adapting unit 160, which is connected on its input side to the proximity sensor 400. The adapting unit is connected to the microphone amplifier 110 and the filter unit 120 in order to adjust them. In particular, the adapter unit 160 is designed to adapt a gain factor of the microphone amplifier 110 and to adjust a filter transfer function of the filter unit 120.

Accordingly, the gain factor and/or the filter transfer function are adjusted during operation of the signal processing unit 100 based on the proximity signal supplied by the proximity sensor 400. The microphone signal is amplified by the respective gain factor by the microphone amplifier 110 and is filtered with the corresponding filter transfer function by the filter unit 120. The resulting compensation signal is subtracted in the summing member 140 from the audio signal amplified by the signal amplifier 130, in order to generate, with subsequent amplification by the output amplifier 150, the speaker signal for the speaker 200. The gain factor or the filter transfer option is adapted as in the previously described implementations and will therefore not be discussed further at this point. The gain factor and the filter transfer function jointly constitute the filter characteristic that is used for filtering the microphone signal.

In the embodiment shown in FIG. 3B, the microphone 320 is arranged together with the speaker 200 in the symbolically illustrated housing 10. In addition to the elements explained in FIG. 3A, the signal processing device 100 in FIG. 3B has an additional summing member 170, which is connected between the microphone amplifier 110 and the filter unit 120. The portion of the speaker signal that is based on the externally supplied audio signal is subtracted via the additional summing member from the amplified microphone signal, which likewise contains components of the audio signal. Again, the compensation signal resulting from the filtering is subtracted in the summing member 140 from the amplified audio signal in order to obtain the speaker signal to be amplified for the speaker 200.

As previously described for the embodiment in FIG. 3A, the adapting unit 160 is designed to adapt the filter characteristic, more particularly the gain factor of the microphone amplifier 110 and the filter transfer function of the filter unit 120, based on the proximity signal.

FIG. 4 shows a frequency diagram of transfer functions TR, TF for filtering the microphone signal. The transfer function TR in this case represents an example of an optimal transfer function for the filtering as determined by measurement, while the transfer function TF characterizes a resulting practical implementation of the filter. The arrows shown in the frequency diagram indicate that, under changing conditions at the headphone, the position or the curve of the optimal filter transfer function TR can change both in terms of frequency and amplitude. If the optimal transfer function TR changes due to the proximity of an object to the headphone in such a manner that the amplitude at a defined frequency decreases, an overcompensation can result with an unchanged filter transfer function TF of the resulting filter, which can lead to the previously described oscillation of the noise-cancellation system. Accordingly, the filter transfer function TF can be adapted by evaluating the proximity signal in such a manner that the oscillation is again prevented. This can be done, for example, by adapting the gain factor over the entire frequency bandwidth. Alternatively or additionally, however, the filter transfer function TF can also be adapted in such a manner that a lower transmission amplitude is only achieved at individual frequencies.

For example, various gain factors or various transfer functions can be stored in the signal processing device 100 of the adapting unit 160. The stored gain factors or transfer functions can then be selected depending on the presence of an object at the headphone or a defined distance away from the headphone.

The proximity sensor can be based on various technologies. For example, FIG. 5 shows an implementation in which the proximity sensor is constructed as a capacitive proximity sensor, wherein the capacitive properties between the illustrated electrodes change due to the presence of the object OBJ. Both the presence of an object OBJ and a specific distance of the object OBJ from the proximity sensor 400 can be determined by means of such a capacitive proximity sensor 400. The proximity signal output by the proximity sensor 400 may comprise information on the distance from the object OBJ, for instance.

FIG. 6 shows an additional implementation of a noise-cancellation system in which the proximity sensor is constructed as an infrared sensor. In particular, the determination of the proximity signal is based on the emission and detection of infrared radiation. For example, infrared radiation that is reflected from the object OBJ is transmitted via an infrared light source such as a light emitting diode emitting light in the infrared range. The reflected infrared radiation is received by an appropriate detector such as a phototransistor or photodiode, with the quantity of the detected infrared radiation allowing an inference of the distance of the object. In the illustrated implementation, multiple sensor elements are provided, each of which can emit and detect radiation, in order to obtain a higher spatial coverage. The infrared radiation is emitted in a pulsed form, for example.

FIG. 7 shows another implementation of a noise-cancellation system for a headphone, the headphone HP being constructed in this case as a headset, such as a Bluetooth headset. In addition to the microphone for receiving the microphone signal, another microphone is provided that receives the speech from the user, for example. Because of the open construction of the headset, it is fundamentally possible for parts of the speaker signal or the acoustic signal emitted by the speaker 200 to be received by the microphone 300, so that in principle an undesired feedback can occur, which leads to oscillations. With the described implementation of the noise-cancellation system, it is possible, for example, for the appearance of oscillations to be prevented by appropriate reduction of the gain factor for the microphone signal, for example when the signal emitted from the speaker 200 in the presence of a nearby object is reflected from the object and received by the microphone 300.

FIGS. 8 and 9 show various implementations of a signal processing device 100 with connected proximity sensor 400 as a block schematic diagram. The illustrated implementations are each designed for processing two channels of audio signals. The signal processing devices 100 each comprise a block ANC, which performs essential parts of the previously described signal processing for the microphone signal and the speaker signal. A respective filter network FN, which is connected to external filter components EFN, is connected to the block ANC. The block ANC is also connected via microphone amplifiers 110, 115 to microphones 300, 310 and via output amplifiers 150, 155 to speakers 200, 210. The block ANC and the amplifiers 110, 115, 150, 155 are supplied from an energy supply unit PMU. A digital control unit DCTRL1, which is coupled via an interface block PROXI to the proximity sensor 400, is also connected to the block ANC.

The proximity sensor 400 comprises a corresponding output interface block PROXO, which is connected to the interface block PROXI. A digital control unit DCTRL2, which is connected to a signal processing block SP, is also provided in the proximity sensor 400. Energy is supplied to the proximity sensor 400 via the corresponding energy supply unit PMU.

In the implementation illustrated in FIG. 8, the proximity sensor 400 is based on infrared radiation, corresponding to the implementation illustrated in FIG. 6. For this sensor, an infrared light-emitting diode is driven via an appropriate block IRLED by means of the block DCTRL2. In addition, a photodiode, the signal of which is transmitted via an analog/digital converter ADC to the signal processing block SP, is connected to a BIAS block. After appropriate processing, the resulting proximity signal is supplied via the interface blocks PROXO, PROXI to the signal processing device 100.

In the implementation illustrated in FIG. 9, the detection of the proximity signal is based on a capacitive measurement. For this purpose, the proximity sensor 400, varying from the implementation in FIG. 8, has an electrode interface ELINT, which is coupled via appropriate analog/digital converters ADC or digital/analog converters DAC to the signal processing block SP. A plurality of electrodes, for example, via which a change in the capacitive properties at the electrodes can be measured during operation, are connected to the electrode interface ELINT.

The various illustrated embodiments can be combined in any desired manner. In particular, different types of proximity sensors 400 can be used in parallel in order to increase the precision in the determination of the proximity signal. In place of a proximity sensor based on infrared radiation or a capacitive proximity sensor, a brightness sensor or a pressure sensor can be used alternatively or additionally as proximity sensors. Particularly if a pressure sensor is used, direct contact with the headphone can be detected, which typically leads to a change of the transmission properties in the headphone. For example, the gain factor for the microphone signal is reduced in case of a high pressure.

In various modifications of the implementations illustrated in FIGS. 8 and 9, a coupling between the proximity sensor 400 and a signal processing device 100 can additionally be accomplished via an intermediate-connected computing unit. It is also possible for the signal processing device 100 and the proximity sensor 400 to be integrated in a common circuit, so the interface blocks PROXI, PROXO can be omitted. Accordingly, the capacitive electrodes or the infrared radiation source and the infrared detector can be directly connected to the integrated circuit.

In the previously illustrated implementations, the signal processing device 100 is shown in each case integrated into a housing of the headphone HP. It is also possible, however, for the signal processing device 100, particularly as an integrated circuit on a semiconductor, to be installed in a supply line of the headphone. It is additionally possible for the signal processing circuit to also be provided directly in an audio device to which the headphone can be connected. In this case, the corresponding speaker signals, microphone signals and proximity signals are to be routed from the headphone to the audio device, or away from the audio device.

The invention claimed is:

1. An active noise-cancellation system for a headphone, which comprises a speaker for emitting a speaker signal, a noise-cancellation microphone for receiving a microphone signal and a proximity sensor for receiving a proximity signal that comprises quantitative information regarding a distance of a human hand from the proximity sensor, wherein presence of the hand establishes a coupling between the speaker and the noise-cancellation microphone, the coupling being dependent on the distance, the noise-cancellation system comprising a signal processing device, which is designed: to generate a compensation signal based on the microphone signal, wherein the generation of the compensation signal comprises filtering with an adaptable filter characteristic; to combine the compensation signal with an audio signal in order to generate the speaker signal; and to adapt the filter characteristic based on the distance.

2. The active noise-cancellation system according to claim 1, wherein the signal processing device is designed to adapt a gain factor of the filter characteristic incrementally or continuously based on the distance.

3. The active noise-cancellation system according to claim 1 or 2, wherein the signal processing device is designed to select a transfer function of the filter characteristic from a group of at least two stored transfer functions based on the distance.

4. The active noise-cancellation system according to claim 1 or 2, wherein the proximity sensor comprises at least one of the following: a capacitive proximity sensor; a proximity sensor based on infrared radiation; a brightness sensor; or a pressure sensor.

5. The active noise-cancellation system according to claim 1 or 2, wherein the signal processing device is constructed as an integrated circuit on a semiconductor body.

6. The active noise-cancellation system according to claim 1 or 2, further comprising the headphone.

7. The active noise-cancellation system according to claim 6, wherein the signal processing device is arranged in the headphone and/or in a supply line for the headphone.

8. The active noise-cancellation system according to claim 6, wherein the proximity sensor is arranged on a housing of the headphone.

9. The active noise-cancellation system according to claim 2, wherein the gain factor is increased for an increasing distance and is decreased for a decreasing distance.

10. The active noise-cancellation system according to claim 1, wherein the filter characteristic is adaptable during operation of the headphone.

11. The active noise-cancellation system according to claim 1, wherein the filter characteristic is adapted such that a transmission characteristic is adapted at individual frequencies.

12. The active noise-cancellation system according to claim 1, wherein the signal processing device comprises an analog filter for generating the compensation signal, the analog filter having the adaptable filter characteristic.

13. The active noise-cancellation system according to claim 1, wherein the microphone signal comprises an external interference noise outside the headphone, which is filtered with the adaptable filter characteristic in order to generate the compensation signal.

14. A method for active noise cancellation for a headphone that comprises a speaker for emitting a speaker signal, a noise-cancellation microphone for receiving a microphone signal and a proximity sensor for receiving a proximity signal that comprises quantitative information regarding a distance of a human hand an object from the proximity sensor, wherein presence of the hand establishes a coupling between the speaker and the noise-cancellation microphone, the coupling being dependent on the distance, the method comprising: generation of a compensation signal based on the microphone signal, wherein the generation of the compensation signal comprises filtering with an adaptable filter characteristic; combining the compensation signal with an audio signal in order to generate the speaker signal; and adapting the filter characteristic based on the distance.

15. The method according to claim 14, wherein the adaptation of the filter characteristic comprises an incremental or continuous adaptation of a gain factor of the filter characteristic based on the distance.

16. The method according to claim 14 or 15, wherein the adaptation of the filter characteristic comprises a selection of a transfer function for the filter characteristic from a group of at least two stored transfer functions based on the distance.

17. The method according to claim 15, wherein the gain factor is increased for an increasing distance and is decreased for a decreasing distance.

18. The method according to claim 14, wherein the proximity sensor comprises a capacitive proximity sensor.

19. The method according to claim 14, wherein the proximity sensor comprises a proximity sensor based on infrared radiation.

20. The method according to claim 14, wherein the proximity sensor comprises a brightness sensor.

21. The method according to claim 14, wherein the proximity sensor comprises a pressure sensor.

22. The method according to claim 14, wherein the filter characteristic is adaptable during operation of the headphone.

23. The method according to claim 14, wherein the filter characteristic is adapted such that a transmission characteristic is adapted at individual frequencies.

24. The method according to claim 14, wherein the generation of the compensation signal comprises filtering the microphone signal with an analog filter having the adaptable filter characteristic.

25. The method according to claim 14, wherein the microphone signal comprises an external interference noise outside the headphone, which is filtered with the adaptable filter characteristic in order to generate the compensation signal.

* * * * *